United States Patent
Chou et al.

(10) Patent No.: US 11,555,842 B2
(45) Date of Patent: Jan. 17, 2023

(54) APPARATUS, SYSTEM AND METHOD FOR PHASE NOISE MEASUREMENT

(71) Applicant: Taiwan Semiconductor Manufacturing Company, Ltd., Hsinchu (TW)

(72) Inventors: Mao-Hsuan Chou, Hsinchu County (TW); Chih-Hsien Chang, New Taipei (TW); Ruey-Bin Sheen, Taichung (TW); Ya-Tin Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 103 days.

(21) Appl. No.: 17/017,677

(22) Filed: Sep. 11, 2020

(65) Prior Publication Data
US 2022/0082602 A1  Mar. 17, 2022

(51) Int. Cl.
  *G01R 29/26* (2006.01)
  *H03L 7/087* (2006.01)
(52) U.S. Cl.
  CPC .............. *G01R 29/26* (2013.01); *H03L 7/087* (2013.01)
(58) Field of Classification Search
  CPC .................. G01R 29/26; H03L 7/087
  See application file for complete search history.

(56) References Cited

U.S. PATENT DOCUMENTS

| | | | | |
|---|---|---|---|---|
| 8,558,728 B1 * | 10/2013 | Lemkin | ..................... | H03L 7/08 341/166 |
| 9,543,970 B2 * | 1/2017 | Liu | ......................... | H03L 7/085 |
| 2012/0217980 A1 * | 8/2012 | Pausini | ................. | G01R 29/26 324/613 |
| 2016/0156342 A1 * | 6/2016 | Yun | ......................... | H03L 7/085 327/158 |
| 2020/0244276 A1 * | 7/2020 | Im | ............................. | G06F 1/04 |

* cited by examiner

*Primary Examiner* — Douglas X Rodriguez
*Assistant Examiner* — Sangkyung Lee
(74) *Attorney, Agent, or Firm* — JCIPRNET

(57) ABSTRACT

A system, a method and a built-in phase noise measurement apparatus are introduced. The built-in phase noise measurement apparatus includes a first DLL and a TDC, in which the first DLL circuit controls a delay of a first signal to generate a second signal based on a control code, tune the control code until a phase of the second signal is aligned to a phase of a reference clock signal, and record a value of the control code when the phase of the second signal is aligned to the phase of the reference clock signal. The DLL circuit controls the delay of the first signal based on the value of the control code after the phase of the second signal is aligned to the phase of the reference clock signal. The TDC determines the phase noise of the first signal based on the reference clock signal and the second signal.

20 Claims, 8 Drawing Sheets

APPARATUS, SYSTEM AND METHOD FOR PHASE NOISE MEASUREMENT

BACKGROUND

A phase noise measurement using probes is costly and complex because the probes, especially high-speed probes, are expensive and the probes suffers contact problems at high temperature. As such, the phase noise measurement using built-in-self-test (BIST) circuit is desired. However, the phase noise measurement using the BIST circuit may be affected by noise or disturbance fro a reference clock signal. As a result, a result of the phase noise measurement is not the pure phase noise.

As the demand for low cost and high performance of the phase noise measurement, a creative technique and design for improving the performance of the phase noise measurement is desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
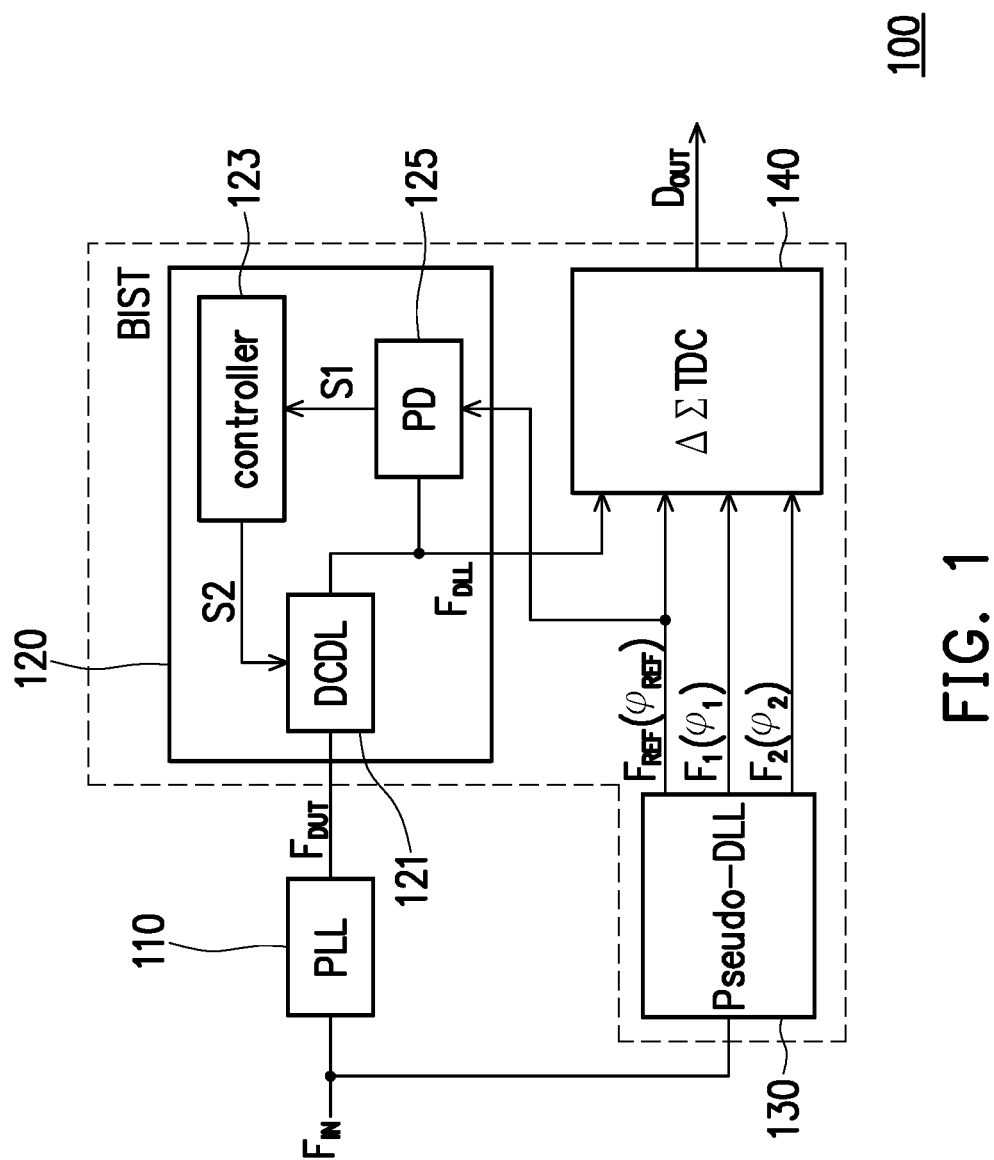
FIG. 1 is a schematic diagram illustrating a system for a phase noise measurement in accordance with some embodiments.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a schematic diagram of a system 100 for measuring a phase noise of a device-under-test (DUT) signal $F_{DUT}$ in accordance with some embodiments. The system 100 may include a DUT 110 and a built-in phase noise measurement apparatus BIST, in which the built-in phase noise measurement apparatus BIST includes a delay locked loop (DLL) circuit 120, a pseudo-DLL circuit 130, and a time-to-digital converter (TDC) 140. In some embodiments, the DUT 110 may be a phase locked loop (PLL) circuit that is configured to receive an input clock signal $F_{IN}$ and output the DUT signal $F_{DUT}$, in which a frequency and a phase of the DUT signal $F_{DUT}$ is aligned to a frequency and a phase of the input clock signal $F_{IN}$ after the PLL circuit 110 is in a locked state. In other words, the frequency and the phase of the DUT signal $F_{DUT}$ are identical to the frequency and the phase of the input clock signal $F_{IN}$ when the PLL circuit 110 is in the locked state. In some embodiments, the DUT signal $F_{DUT}$ may include a phase noise or jitter that may be measured by the system 100.

Figure 2:
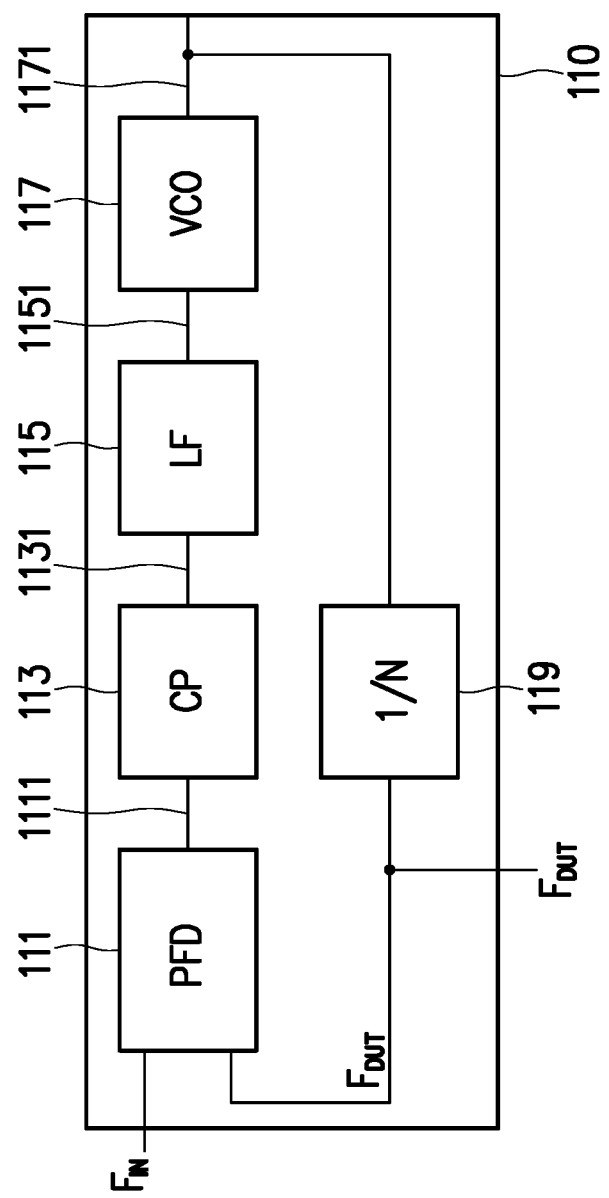
FIG. 2 is a schematic diagram illustrating a device-under-test (DUT) in accordance with some embodiments.

Referring to FIG. 1 and FIG. 2, a schematic diagram of the DUT 110 is illustrated in accordance with some embodiments. The DUT 100 may include circuits of a phase frequency detector (PFD) 111, a charge pump (CP) 113, a lowpass filter (LF) 115, a voltage-controlled oscillator (VCO) 117 and a frequency divider 119. The PFD 111 is configured to detect a phase difference between the input clock signal $F_{IN}$ and a feedback signal (also referred to as the DUT signal $F_{DUT}$), in which the feedback signal is outputted by the frequency divider 119. The PFD 111 may output a signal 1111 that indicates the phase difference between the input clock signal $F_{IN}$ and the feedback signal to the CP 113. The CP 113 may include at least one capacitor (not shown) that is charged or discharged based on the signal 1111, thereby varying a voltage across the capacitor of the CP 113 according to the phase difference detected by the PFD 111. In some embodiments, the voltage across the capacitor of the CP 113 may indicate the phase difference detected by the PFD 111. The CP 113 may output a signal 1131 based on the voltage across the capacitor of the CP 113 to the LF 115. The LF 115 is configured to filter out high frequency components of the signal 1131 to generate a control voltage 1151, and output the control voltage 1151 to the VCO 117. The VCO 117 may receive the control voltage 1151 and is configured to generate an output signal 1171 based on the control voltage 1151. In some embodiments, the VCO 117 is configured to generate the output signal 1171, such that the phase difference between the input clock signal $F_{IN}$ and the feedback signal is reduced. The frequency divider 119 may receive the output signal 1171 and is configured to divide the frequency of the output signal 1171 to a predetermined parameter N to generate the feedback signal or the DUT signal $F_{DUT}$. In some embodiments, when the PLL circuit 110 is in a locked state, the frequency and the phase of the DUT signal $F_{DUT}$ is aligned to the frequency and the phase of the input clock signal $F_{IN}$.

Returning to FIG. 1, the pseudo-DLL circuit 130 is configured to generate clock signals F1, F2 and a reference clock signal $F_{REF}$ based on the input clock signal $F_{IN}$, in which the frequency of the clock signals F1, F2 and the reference clock signals are identical to the frequency of the input clock signal $F_{IN}$. The phase $\varphi_1$ of the clock signal F1 leads the phase $\varphi_{REF}$ of the reference clock signal FREF by a programmable phase difference $\Delta\theta$, and the phase of the reference clock signal FREF leads the phase of the clock signal F2 by the programmable phase difference $\Delta\theta$. The value of the programmable phase difference Δθ may be set by setting parameters for the pseudo-DLL circuit 130. The pseudo-DLL circuit 130 is configured to output the reference clock signal $F_{REF}$ to the DLL circuit 120, and to output the reference clock signal $F_{REF}$, the clock signals F1 and F2 to the TDC 140. The disclosure is not limited to any particular structure and design of the pseudo-DLL circuit 130. Any DLL circuit that is capable of generating different clock signals falls within the scope of the disclosure.

In some embodiments, the DLL circuit 120 is coupled to the DUT 110 and the pseudo-DLL circuit 130 to receive the DUT signal $F_{DUT}$ from the DUT 110 and to receive the reference clock signal $F_{REF}$ from the pseudo-DLL circuit 130. In some embodiments, the DLL circuit 120 includes a digitally controlled delay line (DCDL) 121, a controller 123 and a phase detector (PD) 125. In some embodiments, the DCDL 121 receives the DUT signal $F_{DUT}$ from the DUT 110 and is configured to control a delay of the DUT signal $F_{DUT}$ based on the control code S2 to generate the DLL signal $F_{DLL}$. The DLL signal $F_{DLL}$ may have the same frequency as the DUT signal $F_{DUT}$, and the phase of the DLL signal $F_{DLL}$ in relation to the phase of the DUT signal $F_{DUT}$ is controlled by the controller 123. In some embodiments, the DLL circuit 120 is configured to align the phase of the DLL signal $F_{DLL}$ to the phase of the reference clock signal $F_{REF}$ after the DLL circuit 120 is in a locked state.

In some embodiments, the PD 125 is coupled to the DCDL 121 and the pseudo-DLL circuit 130 to receive the DLL signal $F_{DLL}$ from the DCDL 121 and the reference clock signal $F_{REF}$ from the pseudo-DLL circuit 130. The PD 125 is configured to detect a phase difference between the phase of the DLL signal $F_{DLL}$ and the phase $\varphi_{REF}$ of the reference clock signal $F_{REF}$, and generate a detection signal S1 that indicates the phase difference between the DLL signal $F_{DLL}$ and the reference clock signal $F_{REF}$. In other words, the detection signal S1 may indicate the lead/lag information of the DLL signal $F_{DLL}$ and the reference clock signal $F_{REF}$.

In some embodiments, the controller 123 receives the detection signal S1 from the PD 125 and is configured to tune the control code S2 based on the received detection signal S1. For example, when the detection signal S1 indicates that the phase of the DLL signal $F_{DLL}$ leads the phase of the reference clock signal $F_{REF}$, the controller 123 may increase the control code S2 thereby increasing the delay of the DLL signal $F_{DLL}$. The controller 123 may keep increasing the control code S2 step by step until the phase of the DLL signal $F_{DLL}$ aligns or lags to the phase of the reference clock signal $F_{REF}$. When the detection signal S1 indicates that the phase of the DLL signal $F_{DLL}$ lags the phase of the reference clock signal $F_{REF}$, the controller may decrease the control code S2 thereby decreasing the delay of the DLL signal $F_{DLL}$. The controller 123 may keep decreasing the control code S2 step by step until the phase of the DLL signal $F_{DLL}$ aligns or leads to the phase of the reference clock signal $F_{REF}$. In this way, the controller 123 may tune the control code S2 until the phase of the DLL signal $F_{DLL}$ aligns to the phase of the reference clock signal $F_{REF}$.

In some embodiments, the controller 123 may perform a coarse tuning and a fine tuning to tune the control code S2 quickly and accurately. The controller 123 may increase or decrease the control code S2 step by step in the coarse tuning and fine tuning. For example, the controller 123 may increase or decrease control code S2 by a coarse step amount for each coarse tuning step; and the controller 123 may increase or decrease the control code S2 by a fine step amount for each fine tuning step. In some embodiments, the coarse tuning amount in the coarse tuning is greater than the fine tuning amount in the fine tuning. In this way, the value of the control code S2 that make the phase of the DLL signal $F_{DLL}$ to be aligned to the phase of the reference clock signal $F_{REF}$ may be obtained quickly and accurately.

In some embodiments, when the phase of the DLL signal $F_{DLL}$ aligns to the phase of the reference clock signal $F_{REF}$ and DLL circuit 120 is in the locked state, the DLL circuit 120 is configured to freeze the value of the control code S2 and record the value of the control code S2. The value of the control code S2 may be recorded in a register or a memory or any other suitable device located inside or outside the DLL circuit 120. After the phase of the DLL signal $F_{DLL}$ aligns to the reference clock signal $F_{REF}$, the DLL circuit 120 is configured to disable the PD 125 and the controller 123, such that the DLL circuit 120 acts as an open loop delay line that is configured to delay the DUT signal $F_{DUT}$ using the recorded control code S2 to generate the DLL signal $F_{DLL}$. The DLL signal $F_{DUT}$ that is generated based on the DUT signal $F_{DUT}$ using the recorded control code S2 is provided to the TDC 140 for phase noise measurement. In this way, the noise or disturbance of the reference clock signal $F_{REF}$ does not affect the result of the phase noise measurement, and the pure phase noise of the DUT signal $F_{DUT}$ is measured.

Figure 3:
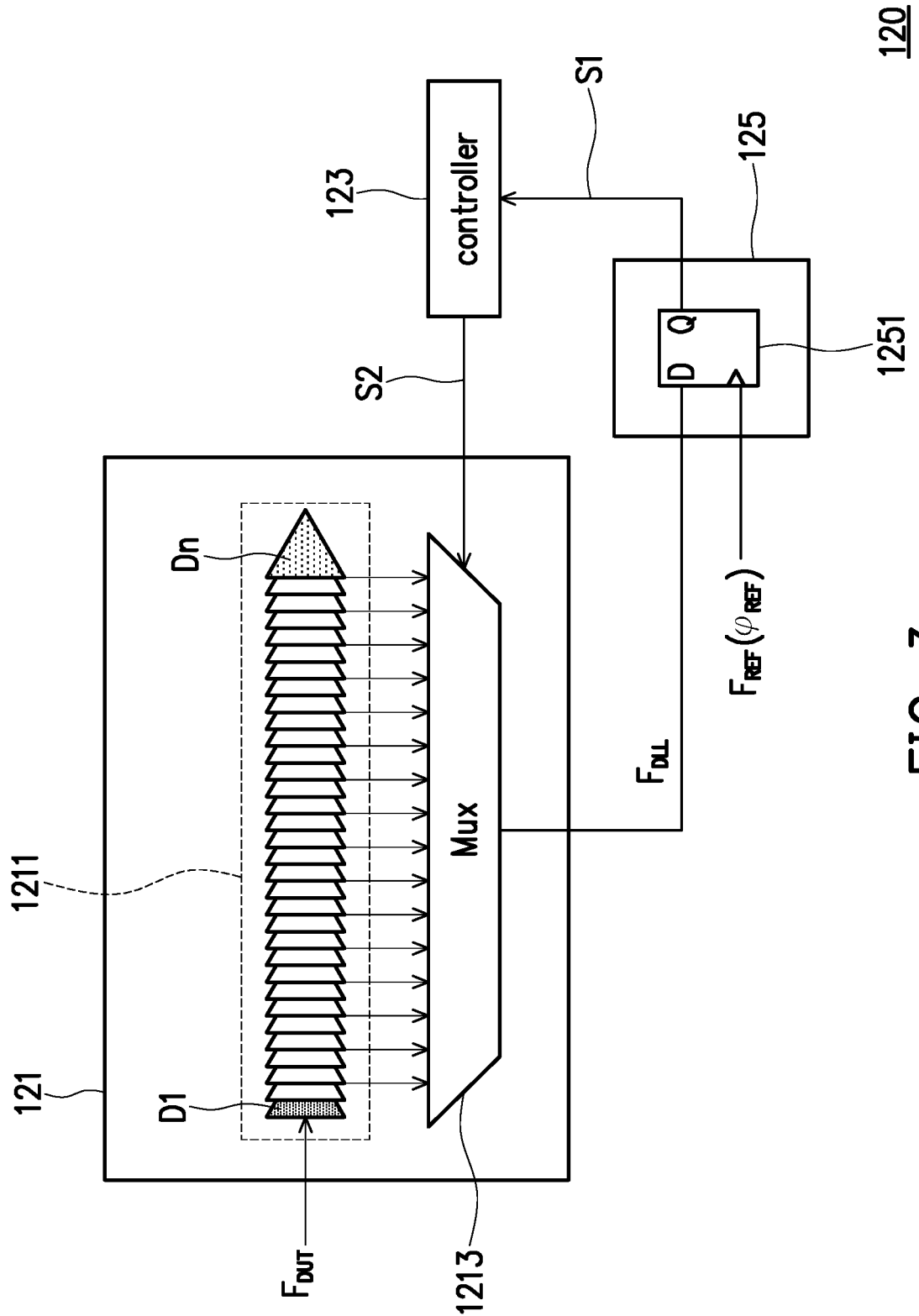
FIG. 3 is a schematic diagram illustrating a delay locked loop (DLL) circuit in accordance with some embodiments.

Referring to FIG. 1 and FIG. 3, FIG. 3 illustrates a schematic diagram of the DLL circuit 120 of the system 100 in FIG. 1 in accordance with some embodiments. Referring to FIG. 3, the DCDL 121 may include a multiplexer 1213 and a delay chain 1211 that includes a plurality of delay elements D1 through Dn connected in series, where n is a positive integer. Each of the delay elements D1 through Dn may include a buffer, but the disclosure is not limited to any specific structure and design of the delay elements D1 through Dn. In some embodiments, the DUT signal $F_{DUT}$ is inputted to the delay chain 1211, and each of the delay elements D1 through Dn of the delay chain 1211 is configured to delay the inputted DUT signal $F_{DUT}$ by a predetermined phase delay amount to output a delay signal.

In some embodiments, the delay elements D1 through Dn of the delay line 1211 are configured to generate a plurality of delay signals from the DUT signal $F_{DUT}$ and output the generated delay signals to the multiplexer 1213. The multiplexer 1213 is configured to select a delay signal among the delay signals outputted by the delay chain 1211 according to the control signal S2 to generate the DLL signal $F_{DLL}$. In some embodiments, when the control code S2 is increased by the processor 123, the multiplexer 123 is configured to select the delay signal with more phase delay amount. When the control code S2 is decreased by the processor 123, the multiplexer 123 is configured to select the delay signal with less phase delay amount. In this way, the phase delay of the DLL signal $F_{DLL}$ in relation to the DUT signal $F_{DUT}$ may be tuned by the control code S2.

In some embodiments, a tuning range of the DCDL 121 is greater than one period of the reference clock signal $F_{REF}$. In other words, the DCDL 121 have a capability to delay the DUT signal $F_{DUT}$ for a delay amount that is greater than a length of one period of the reference clock signal $F_{REF}$. In some embodiments, the number of the delay elements D1 through Dn of the delay chain 1211 in the DCDL 121 is large enough, such that the tuning range of the DCDL 121 is greater than the length of one period of the reference clock signal $F_{REF}$.

In some embodiments, the PD 125 includes a D-flip-flop (DFF) 1251 that is configured to receive the DLL signal $F_{DDL}$ and the reference clock signal $F_{REF}$ as inputs. The DFF 1251 is configured to detect a phase relation between the DLL signal $F_{DDL}$ and the reference clock signal $F_{REF}$ to generate the detection signal S1. In some embodiment, the DLL signal $F_{DDL}$ is inputted to a data input terminal of the DFF 1251 and the reference clock signal $F_{REF}$ is inputted to a clock input terminal of the DFF 1251. In some embodiments, a logic state of the DLL signal $F_{DDL}$ at the rising edges of the reference clock signal $F_{REF}$ is used to determine the phase relationship between the between the DLL signal $F_{DDL}$ and the reference clock signal $F_{REF}$. For example, when the logic state of the DLL signal $F_{DDL}$ is a high logic state (e.g. logic state of "1") at the rising edge of reference clock signal $F_{REF}$, the output of the DFF is the high logic state which indicates that the DLL signal $F_{DDL}$ leads the reference clock signal $F_{REF}$. When the logic state of the DLL signal $F_{DDL}$ is a low logic state (e.g. logic state of "0") at the rising edge of reference clock signal $F_{REF}$, the output of the DFF is the low logic state which indicates that the DLL signal $F_{DDL}$ lags the reference clock signal $F_{REF}$. In this way, the PD 125 may detect a phase relationship between the DLL signal $F_{DDL}$ and the reference clock signal $F_{REF}$. The PD 125 may output the detection signal S1 that indicates the phase relationship between the DLL signal $F_{DDL}$ and the reference clock signal $F_{REF}$ to the processor 123. It is appreciated that the DFF 1251 may configured to detect the phase relationship between the DLL signal $F_{DDL}$ and the reference clock signal $F_{REF}$ using the falling edges of the reference clock signal $F_{REF}$. The processor 123 may tune the control code S2 based on the detection signal S1, thereby tuning the delay of the DLL signal $F_{DLL}$ until the phase of the DLL signal $F_{DLL}$ is aligned to the phase of the reference clock signal $F_{REF}$. After the DLL circuit 120 is in the locked state, the phase of the DLL signal $F_{DLL}$ aligns to the phase of the reference clock signal $F_{REF}$. After the phase of the DLL signal $F_{DLL}$ aligns to the phase of the reference clock signal $F_{REF}$, the DLL circuit 120 may freeze the control code S2 and disable the controller 123 and the PD 125 to switch the DLL circuit 120.

Figure 4:
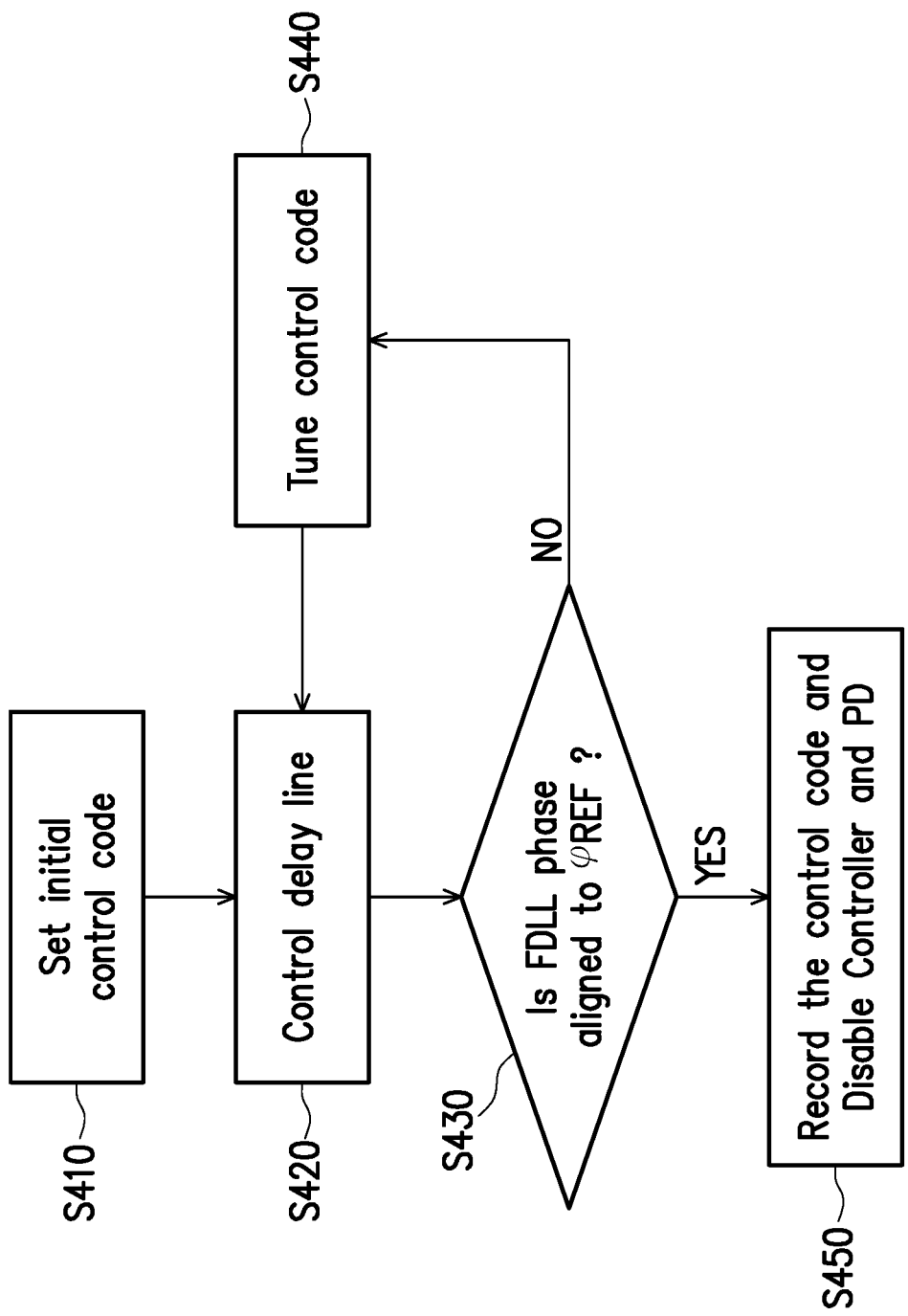
FIG. 4 is a flowchart diagram illustrating an operation of the DLL circuit illustrated in FIG. 3 in accordance with some embodiments.

A flowchart diagram of an operation of the DLL circuit 120 is illustrated in FIG. 4 in accordance with some embodiments. In the operation 5410, the controller 123 may set an initial value for the control code S2. In some embodiments, the control code S2 is a multi-bit value, and the initial value is set to a half of a maximum value of the control code S2. However, the disclosure is not limited to any specific value of the initial control code value of the control code S2. In the operation 5420, the processor 123 controls the delay of the DUT signal $F_{DUT}$ using the DCDL 121 based on the control code S2 to generate the DLL signal $F_{DLL}$. In operation 5430, the PD 125 is configured to determine whether the phase of the DLL signal $F_{DLL}$ is aligned to the phase $\varphi_{REF}$ of the reference clock signal $F_{REF}$. In operation 5440, when the phase of the DLL signal $F_{DLL}$ is not aligned to the phase $\varphi_{REF}$ of the reference clock signal $F_{REF}$, the controller 123 is configured to tune the control code S2 according to a phase relationship (e.g., lead/lag information) between the DLL signal $F_{DLL}$ and the reference clock signal $F_{REF}$. The lead/lag information between the DLL signal $F_{DLL}$ and the reference clock signal $F_{REF}$ may be detected by a phase detector (e.g., the PD 125 in FIG. 3). In operation 5440, the controller 123 may increase the control code S2 when determining that the DLL signal $F_{DLL}$ leads the reference clock signal $F_{REF}$; and the controller 123 may decrease the control code S2 when determining that the DLL signal $F_{DLL}$ lags the reference clock signal $F_{REF}$. The controller 123 may tune the control code S2 until the phase of the DLL signal $F_{DLL}$ aligns to the phase of the reference clock signal $F_{REF}$.

In operation 5450, when the phase of the DLL signal $F_{DLL}$ is aligned to the phase $\varphi_{REF}$ of the reference clock signal $F_{REF}$, the processor 123 stops tuning the control code S2, and the control code S2 are recorded. Meanwhile, the PD 125 and the controller 123 of the DLL circuit 120 are disabled, thereby turning the DLL circuit 120 to be an open loop delay chain. In other words, after the DLL circuit 120 is in a locked state and the phase alignment of the DLL signal $F_{DLL}$ and the reference clock signal $F_{REF}$ is achieved, the DLL circuit 120 controls the DCDL 121 based on the recorded control code S2 to generate the DLL signal $F_{DLL}$ from the DUT signal $F_{DUT}$. The DLL signal $F_{DLL}$ that is generated after the DLL circuit 120 is in the locked state is used for the phase noise measurement. As such, the generation of the DLL signal $F_{DLL}$ after the DLL circuit is in the locked state is independent from the reference clock signal $F_{REF}$. In this way, the result of the phase noise measurement is not affected by the noise or disturbance from the reference clock signal $F_{REF}$.

Figure 5:
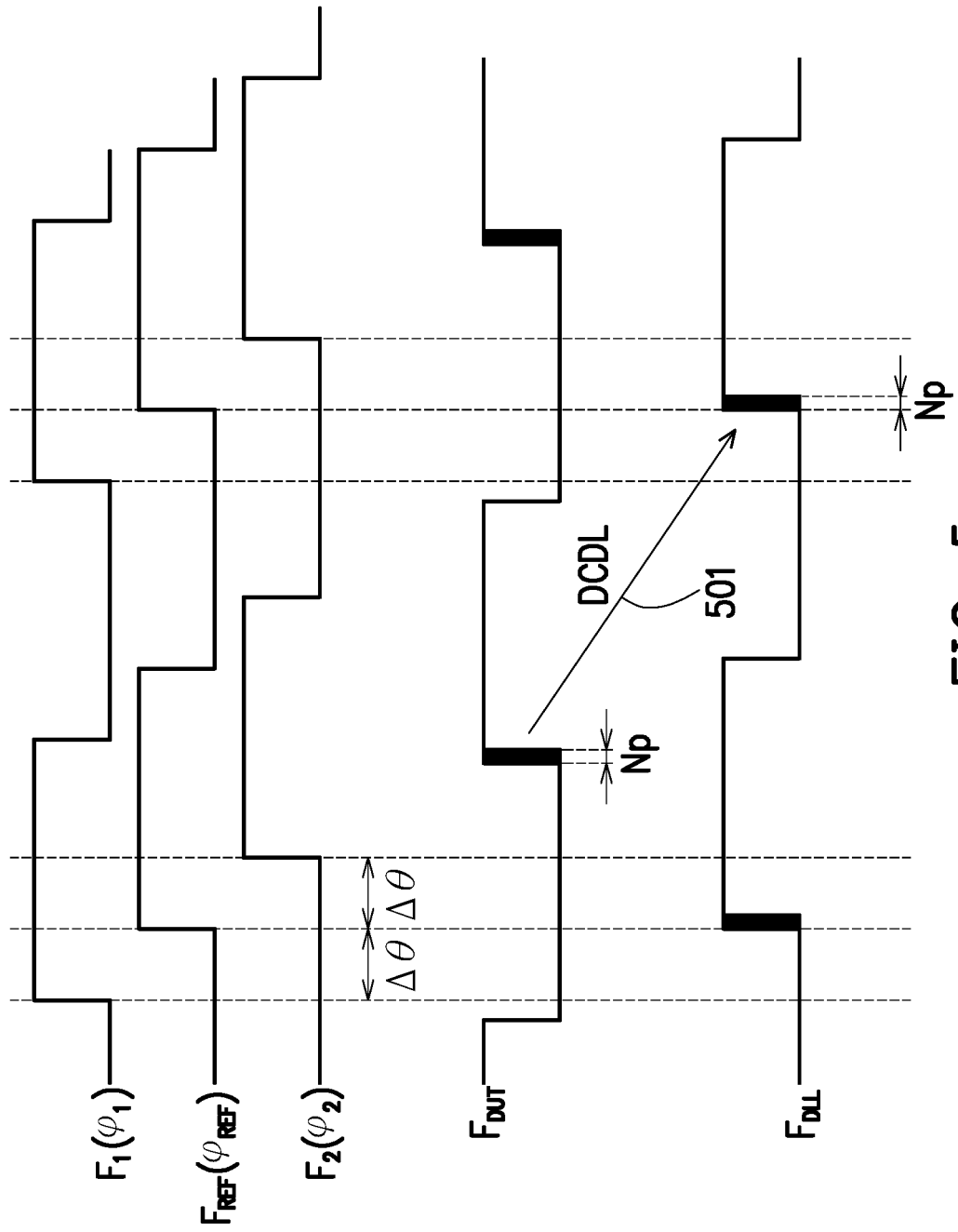
FIG. 5 is a waveform diagram illustrating signals in a system for a phase noise measurement in accordance with some embodiments.

Referring to FIG. 1 and FIG. 5, a waveform diagram illustrating the signals in the system 100 in FIG. 1 is illustrated in accordance with some embodiments. The waveform diagram in FIG. 5 shows waveforms of clock signals F1, F2, the reference clock signal $F_{REF}$, the DUT signal $F_{DUT}$ and the DLL signal $F_{DLL}$. The clock signals F1, F2 and the reference clock signal $F_{REF}$ may be generated by the pseudo-DLL circuit 130 in FIG. 1, in which the clock signal F1 leads the reference clock signal $F_{REF}$ by the programmable phase difference $\Delta\theta$ and the reference clock signal $F_{REF}$ leads the clock signal F2 by the programmable phase difference $\Delta\theta$. The DUT signal $F_{DUT}$ that contains the phase noise Np is delayed by the DCDL 121 to generate the DLL signal $F_{DLL}$. The arrow 501 indicates the delay of the DUT signal $F_{DUT}$ to generate the DLL signal $F_{DLL}$. The phase of the DLL signal $F_{DLL}$ is aligned to the phase of the reference clock signal $F_{REF}$ after the DLL circuit 120 is in the locked state. As shown in FIG. 5, the rising edges and falling edges of the DLL signal $F_{DLL}$ is aligned to the rising edges and the falling edges of the reference clock signal $F_{REF}$. After the DLL circuit is in the locked state, the DLL signal $F_{DLL}$ is generated independently from the reference clocks signal $F_{REF}$, thus the phase noise measurement is not influenced by the noise or disturbance from the reference clock signal $F_{REF}$.

Returning to FIG. 1, in some embodiments, the TDC 140 receives the DLL signal $F_{DLL}$ from the DLL circuit 120 and receives the clock signals F1, F2 and the reference clock signal $F_{REF}$ from the pseudo-DLL circuit 130. The TDC 140 is configured to detect the phase noise of the DUT signal $F_{DUT}$ based on the DLL signal $F_{DLL}$, the clock signals F1, F2 and the reference clocks signal $F_{REF}$, in which the DLL signal $F_{DLL}$ is generated after the DLL circuit 120 is in the locked state. The TDC 140 is further configured to convert the detected phase noise to a digital code $D_{OUT}$. The digital code $D_{OUT}$ indicates the pure phase noise of the DUT signal $F_{DUT}$. In some embodiment, the TDC 140 is a delta-sigma TDC, but the disclosure is not limited thereto.

Figure 6:
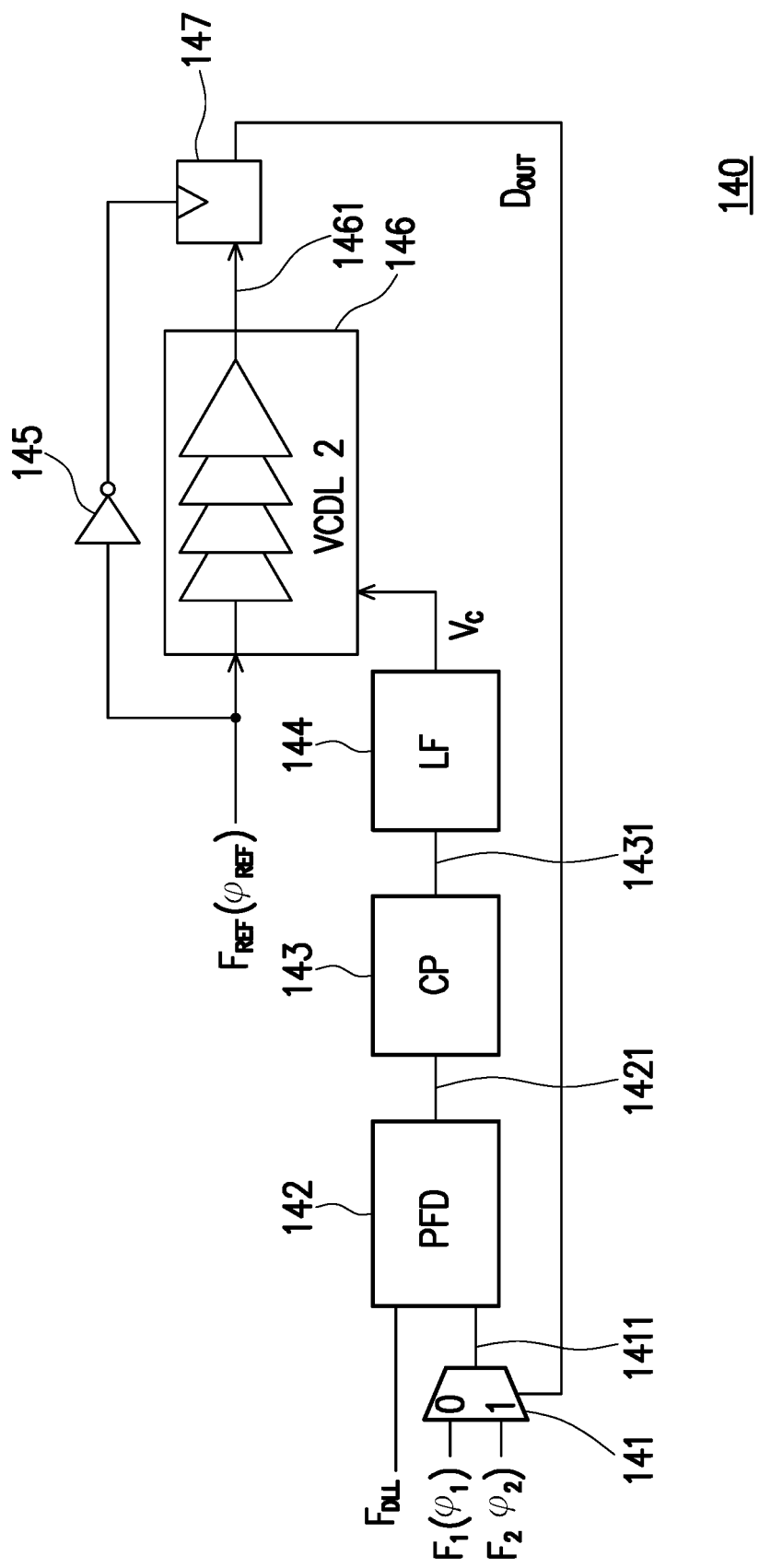
FIG. 6 is a schematic diagram of a time-to-digital converter (TDC) in accordance with some embodiments.

FIG. 6 illustrates a schematic diagram of the TDC 140 in accordance with some embodiments. The TDC 140 may include a multiplexer 141, a PFD 142, a CP 143, a LF 144, a VCDL 146, a NOT logic circuit 145 and a DFF 147. The multiplexer 141 is configured to select one of the clock signals F1 and F2 based on the output $D_{OUT}$ of the DFF 147 as a selected clock signal 1411, and output the selected clock signal 1411 to the PFD 142. In some embodiments, the multiplexer 141 selects the clock signal F1 when the output $D_{OUT}$ of the DFF 147 is a first logic state and selects the clock signal F2 when the output $D_{OUT}$ of the DFF 147 is a second logic state. For example, when the output $D_{OUT}$ of the DFF 147 is the high logic state (e.g., logic state of "1"), the multiplexer 141 selects the clock signal F2 as the selected clock signal 1411. When the output of the DFF 147 is the low logic state (e.g., logic state of "0"), the multiplexer 141 selects the clock signal F1 as the selected clock signal 1411. In some embodiments, the phase $\varphi_1$ of the clock signal F1 may leads the phase $\varphi_2$ of the clock signal F2 by two times of the programmable phase difference $\Delta\theta$ (e.g., $2\Delta\theta$). In some embodiments, a length of $2\Delta\theta$ is greater than a peak-to-peak displacement of the phase noise.

In some embodiments, the PFD 142 receives the selected clock signal 1411 and the DLL signal $F_{DLL}$ and is configured to determine a phase difference between selected clock signal 1411 and the DLL signal $F_{DLL}$. In some embodiments, the clock signal F1 leads the DLL signal $F_{DLL}$ and the DLL signal $F_{DLL}$ leads the clock signal F2. The PFD 142 may output a signal 1421 that indicates the phase difference between the selected clock signal 1411 and the DLL signal $F_{DLL}$ to the CP 143 to control the charge or discharge of a capacitor in the CP 143 based on the signal 1421. The output 1431 of the CP 143 is filtered by the LF 144 to generate a control voltage Vc that is provided to the VCDL 146. The VCDL 146 is configured to delay the reference clock signal $F_{REF}$ based on the control signal Vc to generate the delay signal 1461. The delay signal 1461 is provided to the data terminal of the DFF 147. In some embodiments, the NOT logic gate 145 is configured to invert the received reference clock signal $F_{REF}$, and provide the inverted signal of the reference clock signal $F_{REF}$ to a clock terminal of the DFF 147. In this way, the DFF 147 operates with the falling edge as an active edges of the reference clock signal $F_{REF}$. The output of the DFF 147 is fed back to the multiplexer 141 for selecting the selected clock signal 1411 from the clock signals F1 and F2.

In some embodiments, the output $D_{OUT}$ of the DFF 147 is at the low logic state (logic state of "0") initially, causing the multiplexer 141 to output the clock signal F1 with the phase $\varphi_1$ to the PFD 142. Since the phase $\varphi_1$ of the clock signal F1 leads the phase of the $F_{DLL}$ signal, the CP 143 discharges the capacitor included in the CP 143, thereby lowering the value of the control voltage Vc. As the control voltage Vc is reduced, the VCDL 146 generates shorter delay, causing the phase of the signal 1461 leads the phase of the reference clock signal $F_{REF}$. In a next falling edge of the reference clock signal $F_{REF}$, the output $D_{OUT}$ of the DFF 147 is the high logic state (e.g., logic state of "1"). When the logic state of output $D_{OUT}$ of the DFF 147 is the high logic state, the clock signal F2 with the phase $\varphi_2$ is provided to the PFD 142. Since the phase $\varphi_2$ of the clock signal F2 lags the phase of the signal $F_{DLL}$, the CP 143 charges the capacitor included in the CP 143, thereby increasing the value of the control voltage Vc. As the control voltage Vc is increased, the VCDL 146 generates longer delay, causing the phase of the signal 1461 lags the phase of the reference clock signal $F_{REF}$. In a next falling edge of the reference clock signal $F_{REF}$, the output $D_{OUT}$ of the DFF 147 is the low logic state (e.g., logic state of "0"). As such, if the DLL signal $F_{DLL}$ does not contain phase noise or jitter information, the output $D_{OUT}$ of the TDC 140 is the high logic state and the low logic state alternately. In other words, the output $D_{OUT}$ of the TDC 140 is "101010 . . . " sequentially when the DLL signal $F_{DLL}$ does not contain any phase noise or jitter information. In some embodiments, when the output $D_{OUT}$ of the TDC 140 is different from the sequence of "1" and "0" alternatively (e.g., sequence of "101010 . . . "), it indicates that there is phase noise in the DUT signal $F_{DUT}$. The output $D_{OUT}$ of the TDC 140 is the digital code indicating the phase noise of the DUT signal $F_{DUT}$. In this way, the pure noise phase of the DUT signal $F_{DUT}$ may be detected and converted to the digital code $D_{OUT}$ by the TDC 140.

Figure 7:
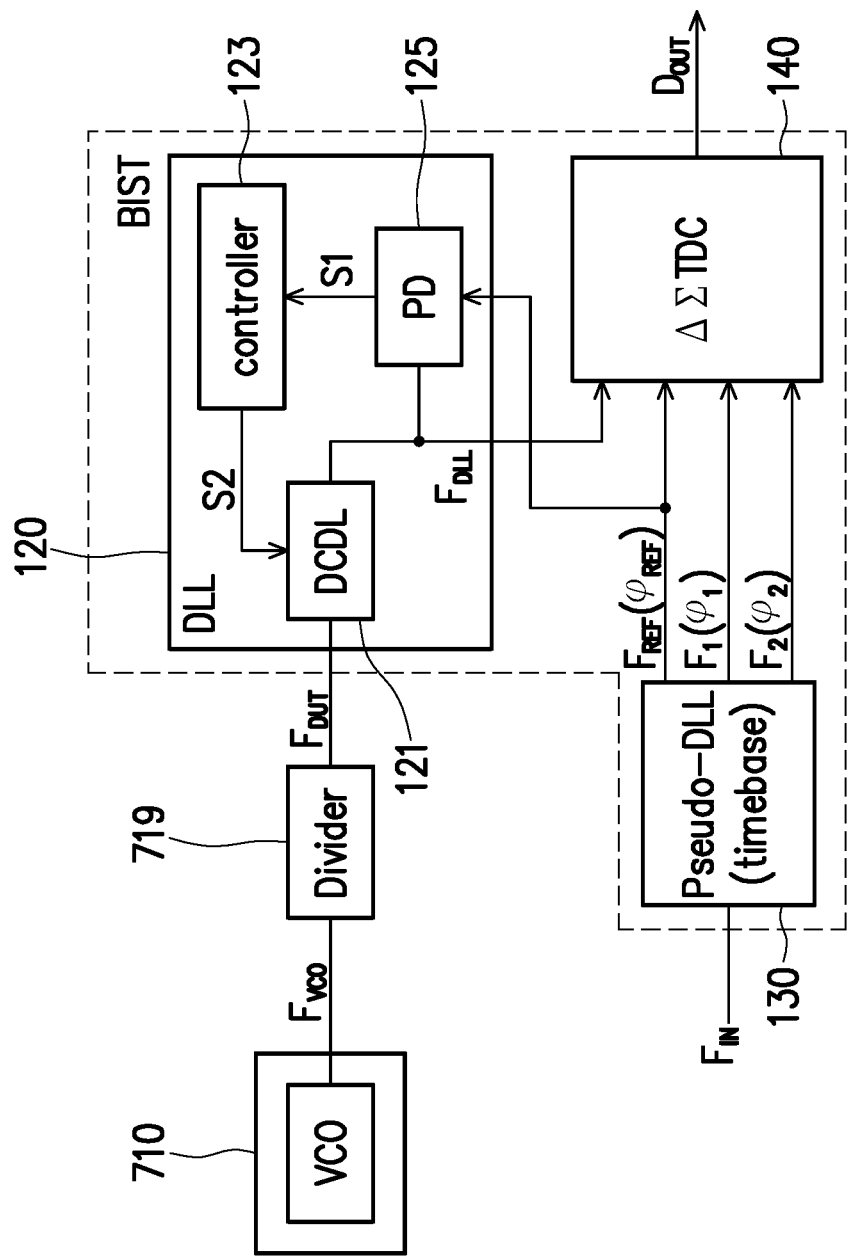
FIG. 7 is a schematic diagram of a system for measuring a phase noise of a signal in accordance with some embodiments.

FIG. 7 is a schematic diagram of a system 700 for measuring a phase noise of a signal in accordance with some embodiments. The system 700 may include a built-in phase measurement apparatus BIST that includes a DLL circuit 120, a pseudo-DLL circuit 130 and a TDC 140 that are same as the DLL circuit 120, the pseudo-DLL circuit 130 and the TDC 140 of the system 100 in FIG. 1, thus the detailed description about the above elements are omitted hereafter. A difference between the system 700 in FIG. 7 and the system 100 in FIG. 1 is that the system 700 includes a circuit 710 and a frequency divider 719. The circuit 710 may include a VCO circuit VCO that is configured to generate a VCO signal $F_{VCO}$. The VCO signal $F_{VCO}$ may contain a phase noise that may be measured by the system 700. The system 700 may measure the pure phase noise of the VCO signal $F_{VCO}$ without an influence of the reference clock signal $F_{REF}$ that is generated by the pseudo-DLL circuit 130. The frequency divider 719 is configured to divide the frequency of the VCO signal $F_{VCO}$ by a predetermined parameter (e.g., parameter N, where N is a positive integer) to obtain a DUT signal $F_{DUT}$, where the frequency of the DUT signal $F_{DUT}$ is lower than the frequency of the VCO signal $F_{VCO}$. In some embodiments, the frequency of the DUT signal $F_{DUT}$ is same as the frequency of the input clock signal $F_{IN}$. In some embodiments, VCO circuit 710 may be a non-PLL circuit, and the system 700 may measure the pure phase noise of the signal from non-PLL circuit 710. In some alternative embodiments, the VCO circuit 710 and the frequency divider 719 may be a circuit included in a PLL circuit. As such, the system 700 may measure the pure phase noise of the DUT signal that is generated from a PLL circuit or a non-PLL circuit.

Figure 8:
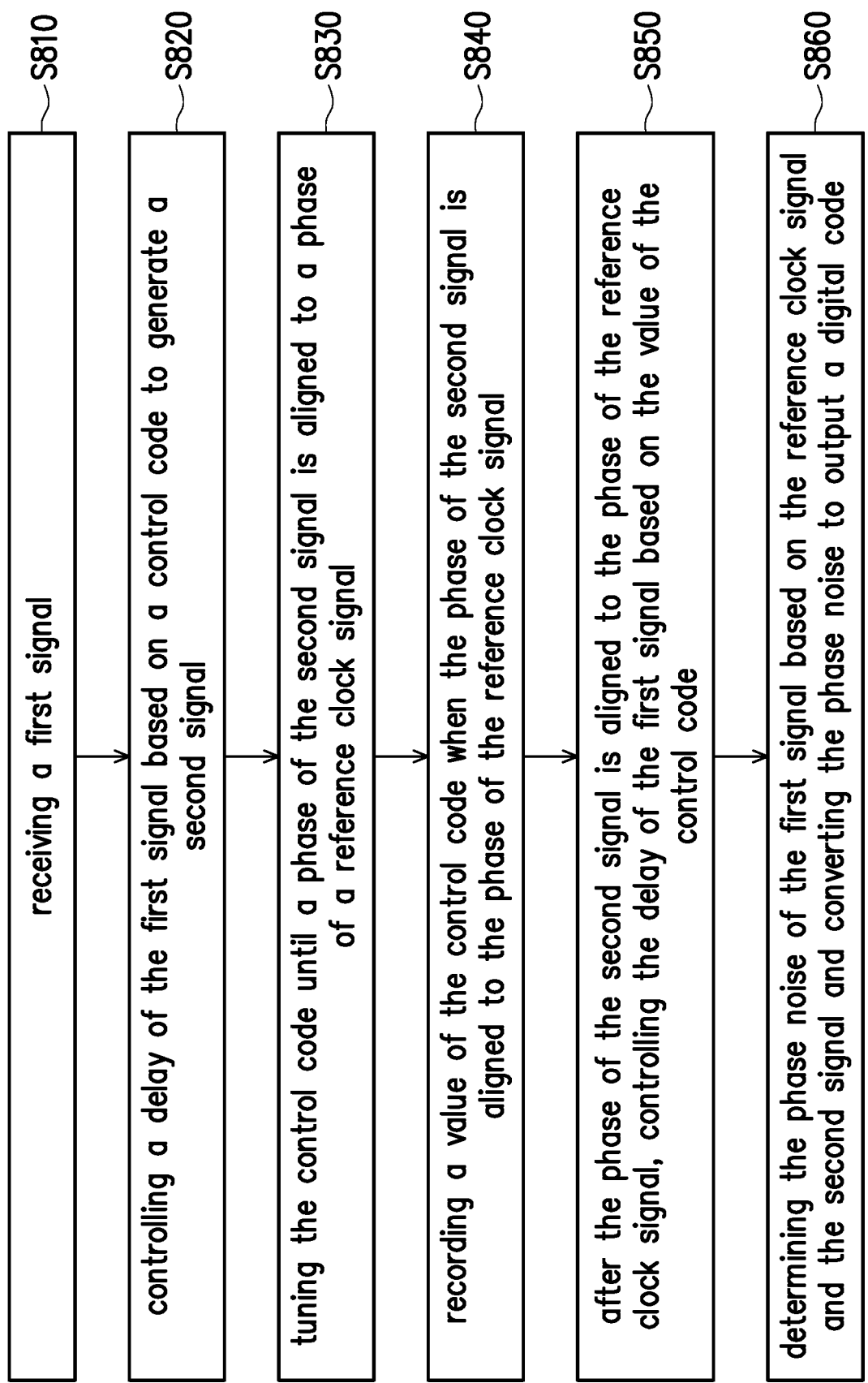
FIG. 8 is a flowchart diagram illustrating a method of measuring a phase noise of a signal in accordance with some embodiments.

FIG. 8 illustrates a flowchart diagram of method of measuring a phase noise of a first signal in accordance with some embodiments. In operation 5810, a first signal is received. In some embodiments, the first signal is a signal generated by a PLL circuit (e.g., PLL circuit 110 in FIG. 1) or a non-PLL circuit (e.g., circuit 710 and the frequency divider 719 in FIG. 7). In some embodiments, the DUT signal contains phase noise. In operation 5820, a delay of the first signal is controlled based on a control code to generate a second signal. In operation 5830, the control code is tuned until a phase of the second signal is aligned to a phase of a reference clock signal. In operation 5840, a value of the control code when the phase of the second signal is aligned to the phase of the reference clock signal is recorded. In operation 5850, the delay of the first signal is controlled based on the value of the control code to generate the second signal after the phase of the second signal is aligned to the phase of the reference clock signal. In operation 5860, the phase noise of the first signal is determined based on the reference clock signal and the second signal and the phase noise is converted to output a digital code.

In accordance with the above embodiments, a DLL circuit is configured to tune a phase of a DUT signal based on a control code until the phase of the DLL signal that is a delay signal of the DUT signal is aligned to a phase of a reference clock signal. After the phase of the DLL signal is aligned to the phase of the reference clock signal and the DLL circuit is in a locked state, the control code is frozen and recorded. After the DLL circuit is in the locked state, some circuits of the DLL circuits are disabled to turn the DLL circuit to be an open loop delay chain that operates based on the recorded control code. In this way, noise and disturbance of the other signal and other circuit (e.g., noise and disturbance of the reference clock signal $F_{REF}$ generated by the pseudo-DLL circuit) does not affect the phase noise measurement. Accordingly, the pure phase noise of the DUT signal may be measured.

In accordance with some embodiments, a system that includes a DUT and a built-in phase noise measurement apparatus is introduced. The DUT is configured to output a first signal. The built-in phase noise measurement apparatus, which includes a first DLL circuit and a TDC, is configured to measure a phase noise of the first signal. The first DLL circuit is coupled to the DUT and is configured to receive the first signal, control a delay of the first signal to generate a second signal based on a control code, tune the control code until a phase of the second signal is aligned to a phase of a reference clock signal, and record a value of the control code when the phase of the second signal is aligned to the phase of the reference clock signal. The TDC is coupled to the first DLL circuit and is configured to determine the phase noise of the first signal based on the reference clock signal and the second signal and convert the phase noise to output a digital code. The DLL circuit is configured to control the delay of the first signal based on the value of the control code after the phase of the second signal is aligned to the phase of the reference clock signal to generate the second signal.

In accordance with some embodiments, a built-in phase noise measurement apparatus that include a first DLL and a TDC is introduced. The first DLL circuit is configured to receive a first signal, control a delay of the first signal to generate a second signal based on a control code, tune the control code until a phase of the second signal is aligned to a phase of a reference clock signal, and record a value of the control code when the phase of the second signal is aligned to the phase of the reference clock signal. The TDC is coupled to the first DLL circuit and is configured to determine the phase noise of the first signal based on the reference clock signal and the second signal and convert the phase noise to output a digital code. The DLL circuit is configured to control the delay of the first signal based on the value of the control code after the phase of the second signal is aligned to the phase of the reference clock signal.

In accordance with some embodiments, a method of measuring a phase noise of a first signal is introduced. The method comprises operations of receiving the first signal; controlling a delay of the first signal based on a control code to generate a second signal; tuning the control code until a phase of the second signal is aligned to a phase of a reference clock signal; recording a value of the control code when the phase of the second signal is aligned to the phase of the reference clock signal; after the phase of the second signal is aligned to the phase of the reference clock signal, controlling the delay of the first signal based on the value of the control code; and determining the phase noise of the first signal based on the reference clock signal and the second signal and converting the phase noise to output a digital code.

In some embodiments, a method includes operations of generating a reference voltage based on at least one of a temperature of a memory array or a threshold voltage of a select transistor of a memory cell of the memory array; generating at least one of a bit line voltage or a word line voltage according to the reference voltage; and driving the memory cell according to the at least one of the bit line voltage or the word line voltage. The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A system, comprising:
    a device under test (DUT), configured to output a first signal; and
    a built-in phase noise measurement apparatus, configured to measure a phase noise of the first signal, the built-in phase noise measurement apparatus comprises:
        a first delay locked loop (DLL) circuit, coupled to the DUT, configured to receive the first signal, control a delay of the first signal to generate a second signal based on a control code, tune the control code until a phase of the second signal is aligned to a phase of a reference clock signal, and record a value of the control code when the phase of the second signal is aligned to the phase of the reference clock signal; and
        a time-to-digital (TDC) converter, coupled to the first DLL circuit, configured to determine the phase noise of the first signal based on the reference clock signal and the second signal and convert the phase noise to output a digital code,
    wherein the first DLL circuit is configured to control the delay of the first signal based on the value of the control code after the phase of the second signal is aligned to the phase of the reference clock signal,
    wherein the first DLL comprises:
        a delay line, comprising a plurality of delay elements, configured to delay the first signal based on the control code to generate the second signal;
        a phase detector, coupled to the delay line, configured to detect a phase difference between the phase of the second signal and the phase of the reference clock signal, and generate a detection signal based on the phase difference; and
        a controller, coupled to the delay line and the phase detector, configured to tune the control code based on the detection signal until the phase of the second signal is aligned to the phase of the reference clock signal, and to record the value of the control code when the phase of the second signal is aligned to the phase of the reference clock signal,
    wherein the first DLL circuit is configured to disable the phase detector and the controller after the phase of tthe second signal is aligned to the phase of the reference clock signal.

2. The system of claim 1, wherein
    the controller is configured to increase the control code when the phasc of the phase of the second signal leads the phase of the reference clock signal, and
    the controller is configured to decrease the control code when the phase of the second signal lags the phase of the reference clock signal.

3. The system of claim 2, wherein
    the second signal that is generated based on the value of the control code after the phase of the second signal is aligned to the phase of the reference clock signal is independent from the reference clock signal.

4. The system of claim 1, wherein the built-in phase noise measurement apparatus further comprising:
a second DLL circuit, coupled to the first DLL circuit and the TDC, configured to generate the reference clock signal, a first clock signal and a second clock signal,
wherein the reference clock signal, the first clock signal and the second clock signal have same frequency, a phase of the reference clock signal lags a phase of the first clock signal, and the phase of the reference clock signal leads a phase of the second clock signal.

5. The system of claim 4, wherein
the TDC is coupled to the second DLL circuit to receive the reference clock signal, the first clock signal and the second clock signal,
the TDC is configured to determine the phase noise of the first signal and convert the phase noise to output the digital code based on the reference clock signal, the second signal, the first clock signal and the second clock signal.

6. The system of claim 1, wherein the DUT includes a phase locked loop circuit that comprises:
a phase-frequency detector, configured to detect a phase difference between an input clock signal and a feedback signal;
a charge pump, coupled to the phase-frequency detector, configured to convert the phase difference between the input clock signal and the feedback signal to generate an analog signal;
a low-pass filter, coupled to the charge pump, configured filter out a high-frequency component of the analog signal to generate a filtered analog signal; and
a voltage-controlled oscillator (VCO), coupled to the low pass filter, configured to generate an output signal, wherein a frequency of the output signal is determined based on a voltage level of the filtered analog signal; and
a frequency divider, coupled to the voltage-controlled oscillator, configured to divide the frequency of the output signal by a predetermined number to generate the feedback signal,
wherein the feedback signal is the first signal.

7. The system of claim 1, wherein the DUT comprises:
a VCO, configured to generate a VCO signal; and
a frequency divider, coupled to the voltage-controlled oscillator, configured to divide a frequency of the VCO signal by a predetermined number to generate the first signal.

8. A built-in phase noise measurement apparatus, configured to measure a phase noise of the first signal, comprising:
a first delay locked loop (DLL) circuit, configured to receive the first signal, control a delay of the first signal to generate a second signal based on a control code, tune the control code until a phase of the second signal is aligned to a phase of a reference clock signal, and record a value of the control code when the phase of the second signal is aligned to the phase of the reference clock signal; and
a time-to-digital (TDC) converter, coupled to the first DLL circuit, configured to determine the phase noise of the first signal based on the reference clock signal and the second signal and convert the phase noise to output a digital code,
wherein the first DLL circuit is configured to control the delay of the first signal based on the value of the control code after the phase of the second signal is aligned to the phase of the reference clock signal,
wherein the first DLL comprises:
a delay line, comprising a plurality of delay elements, configured to delay the first signal based on the control code to generate the second signal;
a phase detector, coupled to the delay line, configured to detect a phase difference between the phase of the second signal and the phase of the reference clock signal, and generate a detection signal based on the phase difference; and
a controller, coupled to the delay line and the phase detector, configured to adjust the control code based on the detection signal until the phase of the second signal is aligned to the phase of the reference clock signal,
wherein the first DLL circuit is configured to disable the phase detector and the controller after the phase of the second signal is aligned to the phase of the reference clock signal.

9. The system of claim 8, wherein the controller is configured to increase the control code when the phase of the second signal leads the phase of the reference clock signal, and
the controller is configured to decrease the control code when the phase of the second signal lags the phase of the reference clock signal.

10. The system of claim 9, wherein
the second signal that is generated based on the value of the control code after the phase of the second signal is aligned to the phase of the reference clock signal is independent from the reference clock signal.

11. The system of claim 8, wherein the built-in phase noise measurement apparatus further comprising:
a second DLL circuit, coupled to the first DLL circuit and the TDC, configured to generate the reference clock signal, a first clock signal and a second clock signal,
wherein the reference clock signal, the first clock signal and the second clock signal have same frequency, a phase of the reference clock signal lags a phase of the first clock signal, and the phase of the reference clock signal leads a phase of the second clock signal.

12. The system of claim 11, wherein
the TDC is coupled to the second DLL circuit to receive the reference clock signal, the first clock signal and the second clock signal,
the TDC is configured to determine the phase noise of the first signal and convert the phase noise to output the digital code based on the reference clock signal, the second signal, the first clock signal and the second clock signal.

13. A method of measuring a phase noise of a first signal, the method comprising:
receiving the first signal;
controlling a delay of the first signal based on a control code to generate a second signal;
tuning the control code until a phase of the second signal is aligned to a phase of a reference clock signal;
recording a value of the control code when the phase of the second signal is aligned to the phase of the reference clock signal;
after the phase of the second signal is aligned to the phase of the reference clock signal, controlling the delay of the first signal based on the value of the control code;

disabling a phase detector and a controller of a built-in phase noise measurement apparatus after the phase of the second signal is aligned to the phase of the reference clock signal; and determining the phase noise of the first signal based on the reference clock signal and the second signal and converting the phase noise to output a digital code.

14. The method of claim 13, wherein tuning the control code until the phase of the second signal is aligned to the phase of the reference clock signal comprises:

detecting, by the phase detector of the built-in phase noise measurement apparatus, a phase difference between the phase of the second signal and the phase of the reference clock signal;

generating, by the phase detector, a detection signal based on the phase difference;

increasing, by the controller of the built-in phase noise measurement apparatus, the control code when the phase of the second signal leads the phase of the reference clock signal; and decreasing, by the controller, the control code when the phase of the second signal lags the phase of the reference clock signal.

15. The method of claim 13, wherein the second signal that is generated based on the value of the control code after the phase of the second signal is aligned to the phase of the reference clock signal is independent from the reference clock signal.

16. The system of claim 1, wherein the plurality of delay elements of the delay line are configured to delay the first signal to generate a plurality of delay signals; and the first DLL circuit further comprises:

a multiplexer, coupled to the delay line and the phase detector, receiving the plurality of delay signals from the delay line, selecting a delay signal among the plurality of delay signals according to the control code to generate the second signal, and outputting the second signal to the phase detector.

17. The system of claim 1, wherein a tuning range of the first DLL circuit is greater than a length of one period of the reference clock signal.

18. The built-in phase noise measurement apparatus of claim 8, wherein the plurality of delay elements of the delay line are configured to delay the first signal to generate a plurality of delay signals; and the first DLL circuit further comprises:

a multiplexer, coupled to the delay line and the phase detector, receiving the plurality of delay signals from the delay line, selecting a delay signal among the plurality of delay signals according to the control code to generate the second signal, and outputting the second signal to the phase detector.

19. The built-in phase noise measurement apparatus of claim 8, wherein a tuning range of the first DLL circuit is greater than a length of one period of the reference clock signal.

20. The method of claim 13, controlling the delay of the first signal based on the control code to generate the second signal comprises:

delaying the first signal to generate a plurality of delay signals; and selecting a delay signal among the plurality of delay signals according to the control code to generate the second signal.

* * * * *